United States Patent
Ha

(10) Patent No.: US 8,507,933 B2
(45) Date of Patent: Aug. 13, 2013

(54) LED LIGHTING DEVICE

(75) Inventor: Jong-Soo Ha, Shenzhen (CN)

(73) Assignees: AAC Acoustic Technologies (Shenzhen) Co., Ltd., Shenzhen (CN); American Audio Components Inc., La Verne, CA (US)

( * ) Notice: Subject to any disclaimer, the term of this patent is extended or adjusted under 35 U.S.C. 154(b) by 0 days.

(21) Appl. No.: 13/190,200

(22) Filed: Jul. 25, 2011

(65) Prior Publication Data

US 2012/0112222 A1    May 10, 2012

(30) Foreign Application Priority Data

Nov. 10, 2010    (CN) .......................... 2010 1 0538702

(51) Int. Cl.
*H01L 33/00* (2010.01)

(52) U.S. Cl.
USPC .............................. 257/98; 257/99; 257/100

(58) Field of Classification Search
USPC ....................................... 257/98–100, E33.06
See application file for complete search history.

(56) References Cited

U.S. PATENT DOCUMENTS

2006/0012299 A1*    1/2006    Suehiro et al. ................ 313/512

* cited by examiner

*Primary Examiner* — Theresa T Doan
(74) *Attorney, Agent, or Firm* — Anova Law Group, PLLC

(57) ABSTRACT

A LED lighting device includes a substrate defining a groove formed by a sidewall and a bottom, a LED chip received in the groove, a reflector attached to the side wall, a circuit protection module electrically connected with the LED chip, and a notch defined on the bottom for receiving the circuit protection module.

4 Claims, 1 Drawing Sheet

LED LIGHTING DEVICE

FIELD OF THE INVENTION

The present disclosure generally relates to the art of electric lighting devices, more particularly to a LED lighting device.

RELATED ART OF THE INVENTION

A LED lighting device is a type of solid-state lighting that utilizes light-emitting diodes (LEDs) as a light source. LEDs convert electricity to light via current through a junction region comprising two different semiconductors, by which electrons and holes coupled at the junction region generate the light. LED's advantages of resistance to impact and nearly limitless lifetime under certain conditions make an LED lighting device a cost-effective yet high quality replacement for incandescent and fluorescent lighting devices.

A LED lighting device, related to the present invention, generally include a LED chip for emitting light. When the LED chip works for a long time, static electricity is produced. And when the static electricity is accumulated for a long time, instantaneous discharge occurs, which will damage the LED chip.

Therefore, an improved LED lighting device that can resolve the problems mentioned-above is desired.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the embodiment.

DETAILED DESCRIPTION OF THE EXEMPLARY EMBODIMENT

Embodiment of the present disclosure will now be described in detail below, with reference to the accompanying drawings.

Figure 1:
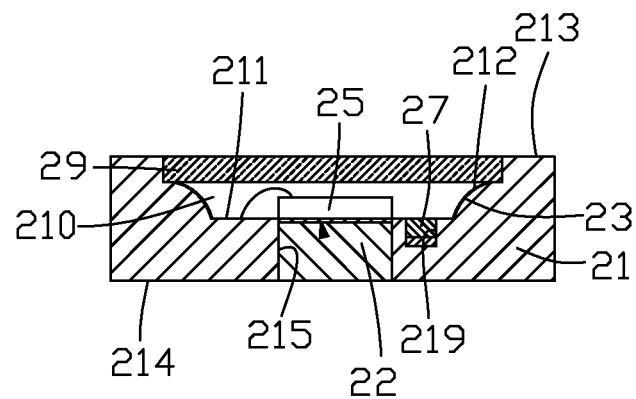
FIG. 1 depicts a cross-sectional view of a LED lighting device in accordance with one exemplary embodiment of the present invention.
Figure 2:
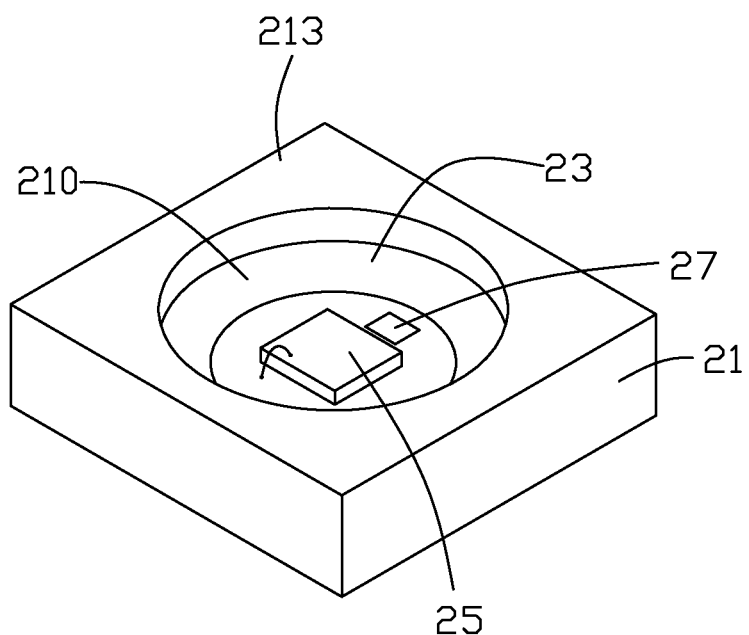
FIG. 2 depicts an isometric view of an internal structure of the LED lighting device in FIG. 1 without a lens.

Referring to FIGS. 1-2, a LED lighting device 2, according to an exemplary embodiment of the present invention, includes a substrate 21 defining a groove 210 formed by a sidewall 212 and a bottom 211, a LED chip 25 received in the groove 210, a reflector 23 attached to the side wall 212, a notch 219 defined on the bottom 211, and a circuit protection module 27 received in the notch 219.

In the embodiment, the substrate 21 is made of ceramic material with good insulation ability. The substrate 21 defines an upper surface 213 and a lower surface 214 opposite to and parallel to the upper surface 213. An outline of the substrate 21 is a square. It is to be understood, in other embodiments, the outline of the substrate 21 can be a circle.

The groove 210 extends towards the lower surface 214 from the upper surface 213, but does not pass through the lower surface 214. The groove is formed by the sidewall 212 and the bottom 211. The bottom 211 is parallel to the upper surface 214. The sidewall 212 surrounds the bottom 211, and an obtuse angle is formed between the bottom 211 and the sidewall 212.

Further, the substrate 21 defines a hole 215 passing through the bottom 211 and the lower surface 214 of the substrate 21. The hole 215 communicates the groove 210 with the external environment.

The LED lighting device 2 furthermore comprises a conductive mass 22 receiving in the hole 215. The conductive mass 22 is made of metal material having lower resistivity and higher thermal conductivity.

An outline of the conductive mass 22 is corresponded to a shape of the hole 215. Therefore, a side of conductive mass 22 is connected tightly to an inner side of the hole 215, for transferring the heat of the conductive mass to the substrate 21 easily. And, an upper surface of the conductive mass 22 is coplanar with the bottom 211, and a lower surface of the conductive mass 22 is coplanar with the lower surface 214 of the substrate 21.

The LED chip 25, for converting electricity to light, defines a lower surface attached to the upper surface of the conductive mass 22. Furthermore, an area of the upper surface of the conductive mass 22 is bigger than or equal to an area of the lower surface of the LED chip 25, so that, the whole area of the lower surface of the LED chip 25 is completely attached to the upper surface of the conductive mass 22. When, the LED chip 25 work for a long time and produce heat, at the same time the heat can transfer to the conductive mass, for reducing the temperature of the LED chip 25 and improving the performance of the LED chip.

In the embodiment, the reflector 23 is a silver layer attached to the sidewall 212 and surrounds the LED chip 25, for reflecting the light emitted from the LED chip 25.

The notch 219 extends the lower surface 214 of the substrate from the bottom 211, but dot not pass the lower surface 214 of the substrate 21. And the notch 219 keeps a distance from the hole 215. The circuit protection module 27 is embedded in the notch 219. A depth of the notch is bigger or equal to a thickness of the circuit protection module 27. So, the circuit protection module 27 does not project outside of the notch 219. Therefore, When the LED chip emits the light all around, the light can directly reach to the reflector without interference of the circuit protection module 27. And so, the light emitted from the LED chip can be more homogenous.

The circuit protection module 27 is electrically connected with the LED chip 25. In the embodiment, the circuit protection module 27 is an ESD protection circuit device (Electro-Static discharge protection circuit device) or a TVS diode for avoiding destroying the LED chip, so that the LED chip can work normally in worktime.

The lens 29 is a flat glass, and has high transmittance. The lens 29 is connected with the substrate 21 and covers the groove 210, for forming a sealed room together with the sidewall and the bottom. In addition, the room is filled with inert gas.

While the present invention has been described with reference to a specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:
1. A LED lighting device, comprising:
a substrate defining a groove formed by a sidewall and a bottom;
a LED chip received in the groove;
a reflector attached to the side wall;

a circuit protection module electrically connected with the LED chip; wherein the bottom defines a notch for receiving the circuit protection module therein.

2. The LED lighting device as described in claim 1, wherein a thickness of the circuit protection module is not greater than a depth of the notch.

3. The LED lighting device as described in claim 1, wherein the substrate defines a hole on the bottom, and a conductive mass is received in the hole and connected with the LED chip.

4. The LED lighting device as described in claim 1 further comprising a lens connected with the substrate and covering the groove.

* * * * *